United States Patent
Park et al.

(10) Patent No.: US 9,129,690 B2
(45) Date of Patent: Sep. 8, 2015

(54) METHOD AND SYSTEM FOR PROVIDING MAGNETIC JUNCTIONS HAVING IMPROVED CHARACTERISTICS

(75) Inventors: Chang-Man Park, Los Altos, CA (US); Dustin William Erickson, Morgan Hill, CA (US); Mohamad Towfik Krounbi, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 470 days.

(21) Appl. No.: 13/553,965

(22) Filed: Jul. 20, 2012

(65) Prior Publication Data
US 2014/0022839 A1    Jan. 23, 2014

(51) Int. Cl.
G11C 11/00     (2006.01)
G11C 11/16     (2006.01)
H01L 43/08     (2006.01)
H01L 43/12     (2006.01)

(52) U.S. Cl.
CPC .............. *G11C 11/161* (2013.01); *H01L 43/08* (2013.01); *H01L 43/12* (2013.01)

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| | | | |
|---|---|---|---|
| 6,984,529 B2 | 1/2006 | Stojakovic et al. | |
| 7,639,456 B2 | 12/2009 | Hong et al. | |
| 7,829,923 B2 | 11/2010 | Li et al. | |
| 7,989,224 B2 | 8/2011 | Gaidis | |
| 8,399,941 B2 * | 3/2013 | Apalkov et al. | 257/421 |
| 8,422,285 B2 * | 4/2013 | Apalkov et al. | 365/171 |
| 2009/0086383 A1 | 4/2009 | Hara et al. | |
| 2009/0159562 A1 | 6/2009 | Cho et al. | |
| 2011/0102948 A1 * | 5/2011 | Apalkov et al. | 360/324.2 |
| 2011/0141804 A1 * | 6/2011 | Apalkov et al. | 365/171 |
| 2011/0170341 A1 * | 7/2011 | Butler | 365/171 |
| 2011/0235217 A1 | 9/2011 | Chen et al. | |
| 2012/0039119 A1 * | 2/2012 | Apalkov | 365/171 |
| 2012/0112295 A1 * | 5/2012 | Apalkov et al. | 257/421 |
| 2012/0168885 A1 * | 7/2012 | Apalkov et al. | 257/421 |
| 2012/0170357 A1 * | 7/2012 | Apalkov et al. | 365/158 |

FOREIGN PATENT DOCUMENTS

| | | |
|---|---|---|
| JP | 2005268252 | 9/2005 |
| JP | 2009176806 | 6/2009 |

* cited by examiner

*Primary Examiner* — Harry W Byrne
(74) *Attorney, Agent, or Firm* — Convergent Law Group LLP (57) ABSTRACT

A method and apparatus provide a magnetic memory including magnetic junctions on a substrate. The apparatus include an RIE chamber and an ion milling chamber. The chambers are coupled such that the magnetic memory is movable between the chambers without exposing the magnetic memory to ambient. The method provides magnetic junction layers and a hard mask layer on the magnetic junction layers. A hard mask is formed from the hard mask layer using an RIE. The magnetic junction layers are ion milled after the RIE and without exposing the magnetic memory to an ambient after the RIE. The ion milling defines at least part of each magnetic junction. A magnetic junction may be provided. The magnetic junction includes pinned, nonmagnetic spacer, and free layers. The free layer has a width of not more than twenty nanometers and is switchable when a write current is passed through the magnetic junction.

8 Claims, 10 Drawing Sheets

METHOD AND SYSTEM FOR PROVIDING MAGNETIC JUNCTIONS HAVING IMPROVED CHARACTERISTICS

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

Figure 1:
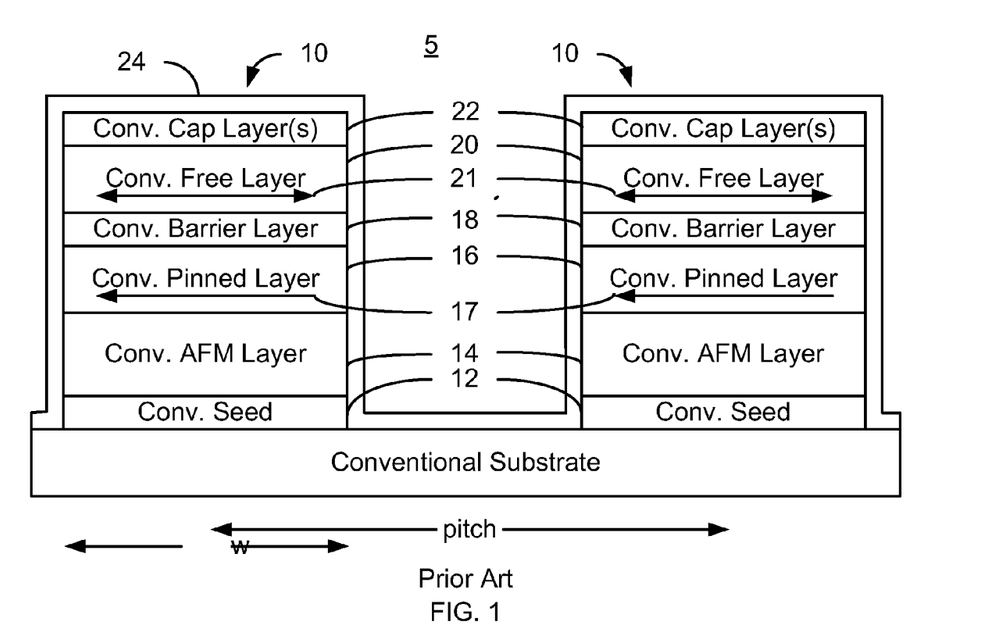
FIG. 1 depicts a conventional magnetic memory including conventional magnetic junctions.

For example, FIG. 1 depicts a conventional STT-RAM 5 including conventional magnetic tunneling junctions (MTJ) 10. The conventional MTJs 10 are separated by a pitch and have widths, w. Typically, the pitch is at least two hundred to three hundred microns or more. The width of the MTJs 10 is typically approximately ninety to one hundred and twenty microns or more. However, an isolated MTJ 10, which is for example, at least three hundred nanometers or more from the nearest MTJ, may be fabricated on the order of twenty-two nanometers or more. The conventional MTJ 10 typically resides on a bottom contact (not shown), uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. A top contact (not shown) typically resides on the MTJ 10. A dielectric capping layer 24 typically covers the MTJs 10.

To switch the magnetization 21 of the conventional free layer 20, a current is driven in the CPP direction. When a sufficient current is driven between the top contact and the bottom contact, the magnetization 21 of the conventional free layer 20 may switch to be parallel or antiparallel to the magnetization 17 of the conventional pinned layer 16. The differences in magnetic configurations correspond to different magnetoresistances and thus different logical states (e.g. a logical "0" and a logical "1") of the conventional MTJ 10. Thus, by reading the tunneling magnetoresistance (TMR) of the conventional MTJ 10 the state of the conventional MTJ can be determined.

Figure 2:
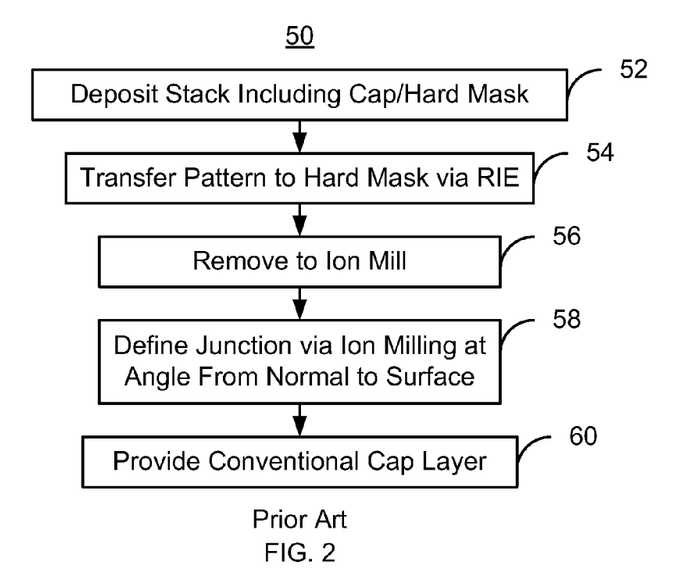
FIG. 2 depicts a conventional method for fabricating magnetic junctions for a conventional magnetic memory.

FIG. 2 depicts a conventional method 50 for fabricating the conventional MTJs 10 in the conventional STT-RAM 5. The stack for the MTJs 10 is deposited and masked, via step 52. For example, the layers 12, 14, 16, 18, 20 and 22 may be deposited across the surface of a wafer. A hard mask layer is also deposited. The hard mask may include materials such as Ta or W.

A pattern for the STT-RAM 5 is transferred to the hard mask using a reactive ion etch (RIE), via step 54. Typically, a photoresist pattern corresponding to the MTJs 10 is provided on the hard mask. The photoresist mask covers the regions in which the MTJs are desired to be formed. In an RIE chamber, a reactive gas appropriate for the hard mask is introduced at a low pressure, typically on the order of a few milliTorr. For example, F or CL may be used for a Ta or W hard mask. The RIE is then performed in step 54 to chemically remove portions of the hard mask layer exposed by the photoresist mask. Consequently, the pattern developed in the photoresist mask may be accurately transferred to the hard mask in step 54.

Once the RIE is performed, the wafer containing the memory 5 is removed from the RIE chamber and transferred to an ion milling chamber, via step 56. During step 56, the wafer is typically exposed to ambient. In other words, the memory 5 is exposed to air. The MTJs are then defined via angled ion milling, via step 58. To perform step 58, the ion milling chamber is evacuated, typically to well below $10^{-5}$ Torr. The low pressure is desired to allow ions, for example from an ion gun, to reach the surface of the wafer and remove portions of the MTJ stack exposed by the hard mask. In contrast to the RIE performed in step 54, step 58 is considered to be a physical, rather than chemical, process. Thus, the ions used in step 58 are desired to be chemically non-reactive with the layers 12, 14, 16, 18 and 20 of the stack. The conventional capping layer 24 may then be deposited, via step 60. Fabrication of the conventional STT-RAM 5 may then be completed.

Although the conventional STT-RAM 5 may be fabricated, there are drawbacks. Ion milling at an angle in step 58 may limit the extent to which the pitch of the conventional STT-RAM 5 may be reduced. Further, it has been determined that the yield of the method 50 may be low. For example, there may be large variations in electrical properties of the conventional MTJs 10. For example, the tunneling magnetoresistance (TMR) and resistance area produce (RA) of the conventional MTJs 10 may differ. These differences may be sufficiently large that the conventional STT-RAM 5 is unusable. Thus, the yield for the conventional method 50 may be low.

Accordingly, what is needed is a method and system that may improve performance of, reduce variations in performance of and, therefore, enhance the yield for the spin transfer torque based memories. The method and system described herein address such a need.

BRIEF SUMMARY OF THE INVENTION

A method and apparatus provide a magnetic memory including magnetic junctions on a substrate. The apparatus include an RIE chamber and an ion milling chamber. The RIE and ion milling chambers are coupled such that the magnetic memory is movable between the RIE and ion milling chambers without exposing the magnetic memory to ambient. In one aspect, the method includes providing magnetic junction layers for the magnetic junction(s) and providing a hard mask layer on the magnetic junction layers. The method also includes forming a hard mask from the hard mask layer using an RIE and ion milling the magnetic junction layers after the RIE and without exposing the magnetic memory to an ambient after the RIE. The step of ion milling the magnetic junction layers defines at least part of each magnetic junction. In another aspect, a magnetic junction is provided. The magnetic junction includes pinned, nonmagnetic spacer, and free layers. The free layer has a width of not more than twenty nanometers and is switchable when a write current is passed through the magnetic junction.

DETAILED DESCRIPTION OF THE INVENTION

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and apparatus for providing a magnetic junction as well as a magnetic memory utilizing the magnetic junction are described. The exemplary embodiments provide A method and apparatus provide a magnetic memory including magnetic junctions on a substrate. The apparatus include an RIE chamber and an ion milling chamber. The RIE and ion milling chambers are coupled such that the magnetic memory is movable between the RIE and ion milling chambers without exposing the magnetic memory to ambient. In one aspect, the method includes providing magnetic junction layers for the magnetic junction(s) and providing a hard mask layer on the magnetic junction layers. The method also includes forming a hard mask from the hard mask layer using an RIE and ion milling the magnetic junction layers after the RIE and without exposing the magnetic memory to an ambient after the RIE. The step of ion milling the magnetic junction layers defines at least part of each magnetic junction. In another aspect, a magnetic junction is provided. The magnetic junction includes pinned, nonmagnetic spacer, and free layers. The free layer has a width of not more than twenty nanometers and is switchable when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic junctions, other physical phenomenon and fabrication techniques. Consequently, one of ordinary skill in the art will readily recognize that theoretical explanations of the behavior of the method and system are made based upon this current understanding of spin transfer, magnetic junctions, other physical phenomenon and fabrication techniques. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 3:
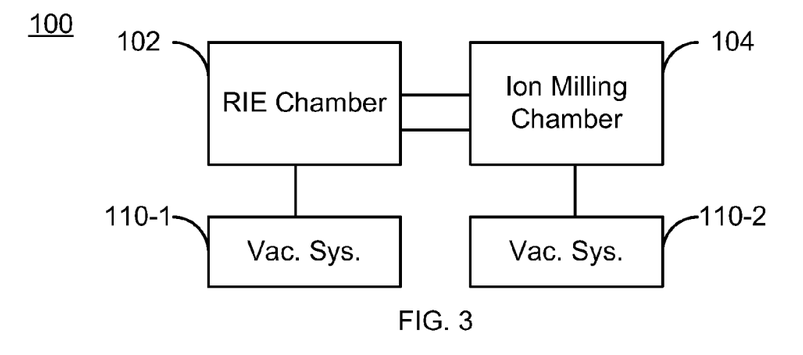
FIG. 3 depicts an exemplary embodiment of an apparatus for fabricating magnetic junctions for a magnetic memory.

FIG. 3 is a block diagram depicting an exemplary embodiment of an apparatus 100 for fabricating magnetic junctions for a magnetic memory. The apparatus 100 may be part of a larger system incorporating additional components. Alternatively, the apparatus 100 may be a stand-alone system. For clarity, only some components of the apparatus 100 are shown in FIG. 3. The apparatus 100 includes a reactive ion etch (RIE) chamber 102 and an ion milling chamber 104, which are connected. In some embodiments, a central interlock chamber (not shown) may be between the RIE chamber 102 and the ion milling chamber 104. The RIE chamber 102 is the chamber in which an RIE is performed. The RIE chamber is thus configured to allow for chemical interactions that remove portions of layer(s) of the device during fabrication. The RIE chamber 102 may also include a gas delivery system to introduce reactive gases into the RIE chamber 102.

The apparatus 100 also includes an ion milling chamber 104 which is used in defining the magnetic junction. The ion milling chamber 104 may thus include an ion source (not shown) such as an ion gun and may be evacuated to extremely low pressures suitable for ion milling.

Also shown are vacuum system 110-1 and 110-2 for the RIE chamber 102 and the ion milling chamber 104, respectively. Two vacuum systems 110-1 and 110-2 are shown as the RIE chamber 102 and the ion milling chamber 104 may have different requirements. More specifically, the ion milling chamber 104 may be desired to run at a much higher vacuum (i.e. lower pressure) in order to ensure that ions from the ion source can reach the device being fabricated. In addition, it may be desirable to have separate vacuum systems 110-1 and 110-2 because the RIE chamber 102 generally contains reactive gases used in the RIE. It may be desirable to isolate such gases from any portion of the ion milling chamber 104, including the vacuum system 110-2. However, in other embodiments, a single vacuum system may be used for both chambers 102 and 104.

In addition to being configured for their individual processing steps, the RIE chamber 102 and the ion milling chamber 104 are also connected. More specifically, the RIE chamber 102 and the ion milling chamber 104 are coupled such that the magnetic memory is movable between the RIE chamber 102 and the ion milling chamber 104 without exposing the magnetic memory to an ambient (i.e. the atmosphere external to the system 100). Thus, both the RIE chamber 102 and the ion milling chamber 104 may be under vacuum for transfer of the substrate containing the devices being fabricated between the chambers 102 and 104. In addition, some transfer mechanism (not shown) may also be part of the apparatus 100. The transfer mechanism may be used to move the magnetic memory between the chambers 102 and 104 while they are isolated from the ambient e.g. under vacuum).

In the embodiment shown, the RIE chamber 102 and the ion milling chamber 104 are not directly connected. Thus, a transfer tube or analogous component may connect the chambers 102 and 104. In other embodiments, the RIE chamber 102 may be directly connected to the ion milling chamber 104. In such embodiments, a door or analogous mechanism may separate the chambers 102 and 104 during use. Consequently, different processes may be carried out in one of the chambers 102 or 104 without impacting the other chamber 104 or 102, respectively.

The apparatus may be used to improve fabrication of magnetic junctions in magnetic memories. For example, it is possible to perform an RIE followed by an ion mill on devices on the substrate without exposing the magnetic devices to ambient. Similarly, it is also possible to perform an ion mill followed by an RIE on devices on the substrate without exposing the magnetic devices to ambient. This may result in improved performance of the magnetic junctions. For example, it has been determined that in the conventional method 50 depicted in FIG. 2, there may be redeposition of the hard mask materials after the RIE is performed. The hard mask may be made of materials such as W or Ta. The RIE performed may use cases such as F or Cl. Redeposition of materials such as WF or WCl may occur. It has been determined that when the magnetic memory is exposed to ambient in step 54, the F or Cl may react with water vapor in the air, forming HF or HCl. These compounds are very acidic and may damage the underlying stack of magnetic materials. Thus, the free layer 20, barrier layer 18, and/or pinned layer 16 may be damaged. Performance of the conventional magnetic junctions 10 may suffer. In contrast, use of the system 100 may allow a hard mask or other RIE and ion milling of magnetic junction(s) to occur without exposure to ambient. Consequently, the formation of the acids may be avoided. Thus, damage to the magnetic junctions may be avoided. Use of the apparatus 100 may thus enhance performance of magnetic junctions formed using the apparatus 100.

Figure 4:
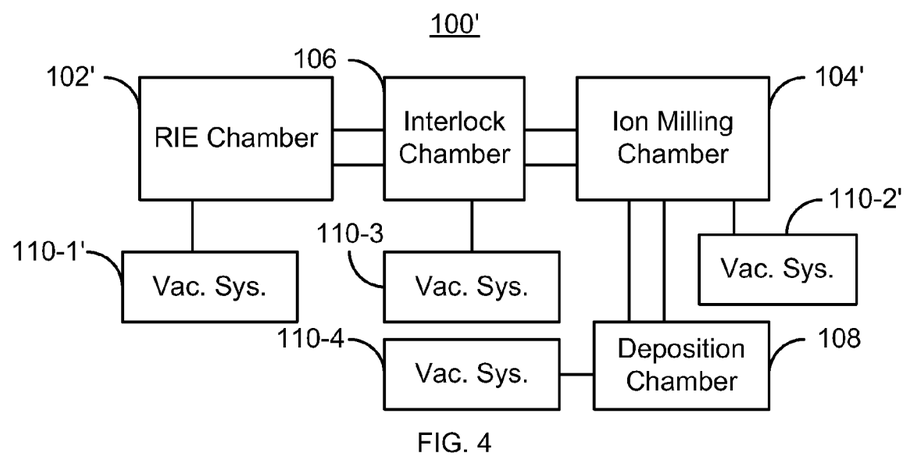
FIG. 4 depicts another exemplary embodiment of an apparatus for fabricating magnetic junctions for a magnetic memory.

FIG. 4 is a block diagram depicting an exemplary embodiment of an apparatus 100' for fabricating magnetic junctions for a magnetic memory. The apparatus 100' may be part of a larger system incorporating additional components. Alternatively, the apparatus 100' may be a stand-alone system. For clarity, only some components of the apparatus 100' are shown in FIG. 4. The apparatus 100' is analogous to the apparatus 100. The apparatus 100' includes an RIE chamber 102' and an ion milling chamber 104' that are analogous to the RIE chamber 102 and the ion milling chamber 104, respectively. Thus, the structure and function of the chambers 102' and 104' may be analogous to the structure and function of the chambers 102 and 104, respectively.

The apparatus 100' also includes an interlock chamber 106 and a deposition chamber 108. In some embodiments, chamber 106 and/or 108 may be omitted. The interlock chamber 106 is coupled between the RIE chamber 102' and the ion milling chamber 104'. The ion milling chamber 104' is connected to the deposition chamber 106. In alternate embodiments, the interlock chamber 106 may be a central chamber directly connected to the chambers 102, 104 and 108. The interlock chamber 106 may also be the central entrance for loading/unloading of the apparatus 100'. However, in other embodiments, one or more of the other chambers 102', 104' and/or 108 may have an entrance to directly load or unload the substrates. In the embodiment shown, each chamber 102', 140', 106 and 108 has its own vacuum system 110-1', 110-2', 110-3 and 110-4, respectively. In other embodiments, one or more of the vacuum system 110-1', 110-2', 110-3, and/or 110-4 may be combined to evacuate multiple chambers.

The interlock chamber 106 is isolatable from the ambient, for example using the vacuum system 110-3. In addition, the interlock chamber 106 may facilitate movement of the magnetic memory between the RIE chamber 102' and the ion milling chamber 104' without exposure to the ambient. For example, the interlock chamber 106 may be evacuated and the magnetic memory moved from the RIE chamber 102' to the interlock chamber. The RIE chamber 102' may then be isolated from the interlock chamber 106. The magnetic memory may then be moved from the interlock chamber 106 to the ion milling chamber 104'. The deposition chamber 108 is also connected to the ion milling chamber 104' such that the magnetic memory may be moved between the ion milling chamber 104' and the deposition chamber 108 without exposure to ambient. Further, because the magnetic memory may be moved between the RIE chamber 102' and the ion milling chamber 104' without exposure to ambient and because the magnetic memory may be moved between the ion milling chamber 104' and the deposition chamber 108 without exposure to ambient, the magnetic memory may be moved between the RIE chamber 102' and the deposition chamber 108 without exposure to ambient.

The apparatus 100' shares the benefits of the apparatus 100. In particular, an RIE followed by an ion mill and/or an ion mill followed by an RIE may be performed without exposing the magnetic memory to ambient between the processes. For the reasons described above, this may result in magnetic junctions having improved performance. Furthermore, a layer, such as a capping layer, may be deposited after an RIE and/or ion mill without exposing the magnetic memory to ambient between the processes. Thus, further damage to the magnetic devices being formed may be reduced or eliminated.

Figure 5:
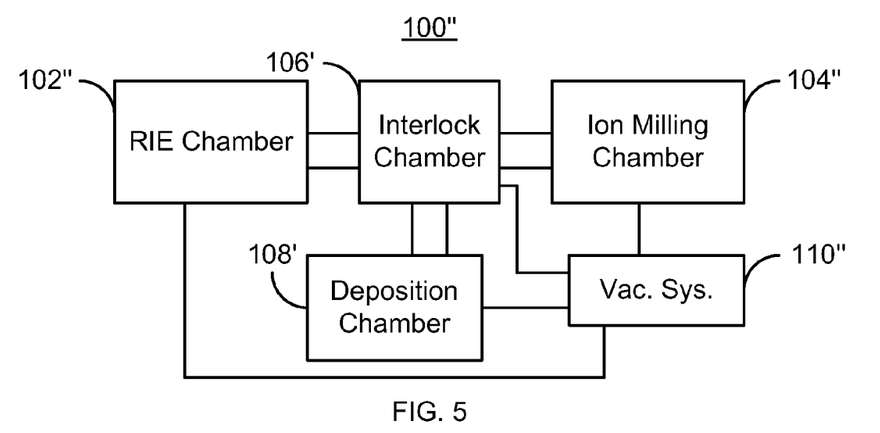
FIG. 5 depicts another exemplary embodiment of an apparatus for fabricating magnetic junctions for a magnetic memory.

FIG. 5 is a block diagram depicting an exemplary embodiment of an apparatus 100" for fabricating magnetic junctions for a magnetic memory. The apparatus 100" may be part of a larger system incorporating additional components. Alternatively, the apparatus 100" may be a stand-alone system. For clarity, only some components of the apparatus 100" are shown in FIG. 5. The apparatus 100" is analogous to the apparatus 100 and 100'. The apparatus 100" includes an RIE chamber 102", an ion milling chamber 104', the interlock chamber 106' and a deposition chamber 108' that are analogous to the RIE chamber 102/102', the ion milling chamber 104/104', the interlock chamber 106, and the deposition chamber 108, respectively. Thus, the structure and function of the chambers 102", 104", 106' and 108' may be analogous to the structure and function of the chambers 102/102', 104/104', 106, and 108, respectively.

The interlock chamber 106' is central to all chambers 102", 104" and 108'. Thus, a magnetic memory may be moved from one chamber 102", 104" and/or 106' to another chamber 102", 104" and/or 106' without exposing the magnetic memory to ambient. Thus, any of the RIE, ion milling and deposition processes for the chambers 102", 104" and 106' may be performed without exposing the magnetic memory to ambient between the processes.

The apparatus 100" also includes a single vacuum system 110" that is analogous to the combination 110-1 and 110-2 and the combination 110-1', 110-2', 110-3 and 110-4. Thus, the vacuum system 110" evacuates any one or more of the chambers 102", 104", 106' and/or 108'. In another embodiment, the vacuum system 110" may be split into one or more separate components as in the system 100 or 100'.

The apparatus 100" shares the benefits of the apparatus 100/100'. In particular, an RIE followed by an ion mill and/or an ion mill followed by an RIE may be performed without exposing the magnetic memory to ambient between the processes. For the reasons described above, this may result in magnetic junctions having improved performance. Furthermore, a layer, such as a capping layer, may be deposited after an RIE and/or ion mill without exposing the magnetic memory to ambient between the processes. Thus, further damage to the magnetic devices being formed may be reduced or eliminated.

Figure 6:
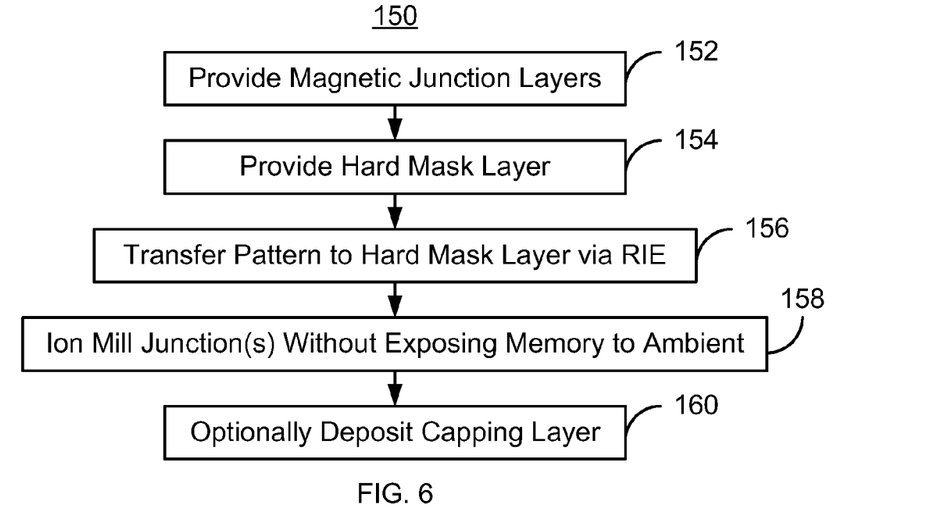
FIG. 6 depicts an exemplary embodiment of a method for fabricating a magnetic junction in a magnetic memory using the apparatus.

FIG. 6 depicts an exemplary embodiment of a method 150 for fabricating a magnetic junction in a magnetic memory using the apparatus. For simplicity, some steps may be omitted, combined, interleaved and/or performed in another order. The method 150 is described in the context of the apparatus 100. However, the method 150 may be used with other apparatus such as the apparatus 100', 100" and/or another analogous apparatus. Further, the method 150 may be incorporated into fabrication of magnetic memories. Thus the method 150 may be used in manufacturing a STT-RAM or other magnetic memory. The magnetic junction being fabricated is switchable between a plurality of stable magnetic states when a write current is passed through the magnetic junction.

The magnetic junction layers are provided, via step 152. Step 152 may include depositing the desired materials at the desired thicknesses. Step 152 includes depositing any seed, pinning (e.g. antiferromagnetic), pinned, nonmagnetic spacer and free layers. In some embodiments, step 152 includes providing a single pinned layer, a barrier layer such as MgO, and a free layer. In some such embodiments, step 152 also includes depositing a second barrier layer such as MgO and a second pinned layer. First and second pining layers may also be deposited. The pinned layer(s) and/or free layer may be a SAF.

A hard mask layer is also provided, via step 154. The hard mask may, for example, include W and/or Ta. Step 154 may include blanket depositing the hard mask layer on the magnetic junction layers. Steps 152 and 154 may be performed in the apparatus 100, for example if a deposition chamber is part of the apparatus 100.

A hard mask is formed from the hard mask layer using an RIE, via step 156. The RIE of step 156 may be performed in the RIE chamber 102. The RIE performed in step 156 may use reactive gases at pressures on the order of one millitorr.

After the RIE is performed in step 156, the magnetic junction is at least partially defined using ion milling, via step 158. In some embodiments, the magnetic junction is completely defined. Thus, all of the layers provided in step 152 for the magnetic junction are milled through in step 158. In other embodiments, the layers are partially milled through. Defining of the magnetic junction may be completed using other processes including but not limited to an additional ion mill and/or an additional RIE.

The ion milling of step 158 may be performed in the ion milling chamber 104. Thus, the ion milling of step 158 is performed without exposing the magnetic memory (and thus the magnetic devices being formed) to an ambient between the RIE and the ion mill. Gas(es) used in the RIE of step 156 are substantially prevented from interfering with the ion mill. In some embodiments, the gas(es) used in the RIE of step 167 are substantially prevented from entering the ion mill chamber 104. For example, the ion mill may be performed at pressures on the order of $10^{-8}$ through $10^{-9}$ Torr. The RIE chamber 102 might be evacuated to substantially the same pressure as the ion milling chamber 104 before the magnetic memory is transferred to the chamber 102. In some embodiments, both chambers 102 and 104 are under vacuum when the magnetic memory may be moved from the RIE chamber 102 to the ion milling chamber 104. Alternatively, the RIE chamber 102 might be evacuated and an inert gas introduced. The magnetic memory may then be moved to the ion milling chamber 104 which includes the inert gas preferably at a similar pressure. The ion milling chamber 104 can then be evacuated and ion milling proceed. In another embodiment, the transfer between the chambers 102 and 104 may proceed in another manner. However, the magnetic memory may be transferred between the chambers 102 and 104 without exposing the magnetic memory, and thus the magnetic devices, to ambient and substantially without adversely affecting the processes in steps 156 and 158.

A capping layer may optionally be deposited, via step 160. The capping layer may be a dielectric. For example, silicon oxide, silicon nitride, and/or aluminum oxide may be used. The capping layer may be used to protect the sides of the magnetic junctions from damage. In some embodiments, the capping layer is deposited after the ion milling step and without exposing the magnetic memory to the ambient after the ion milling step 158.

The method 150 may then be continued to complete fabrication of the magnetic device. In some embodiments, this includes completing the removal of portions of the magnetic junction layers to define the magnetic junction. This may include performing additional ion mill(s) and/or additional RIE(s) of the structure. Additional capping layers may also be deposited. Some or all of these processes may be carried out without exposing the magnetic memory to the ambient. For example, the magnetic memory may be move between chambers 102/102'/102", 104/104'/104", 106/106', and/or 108/108' without opening the system 100/100'/100".

The method 150 may share the benefits of the apparatus 100,100' and/or 100". In particular, magnetic memories having improved performance and reduced variations in performance may be fabricated. Thus, yield for the method 150 may be enhanced.

Figure 7:
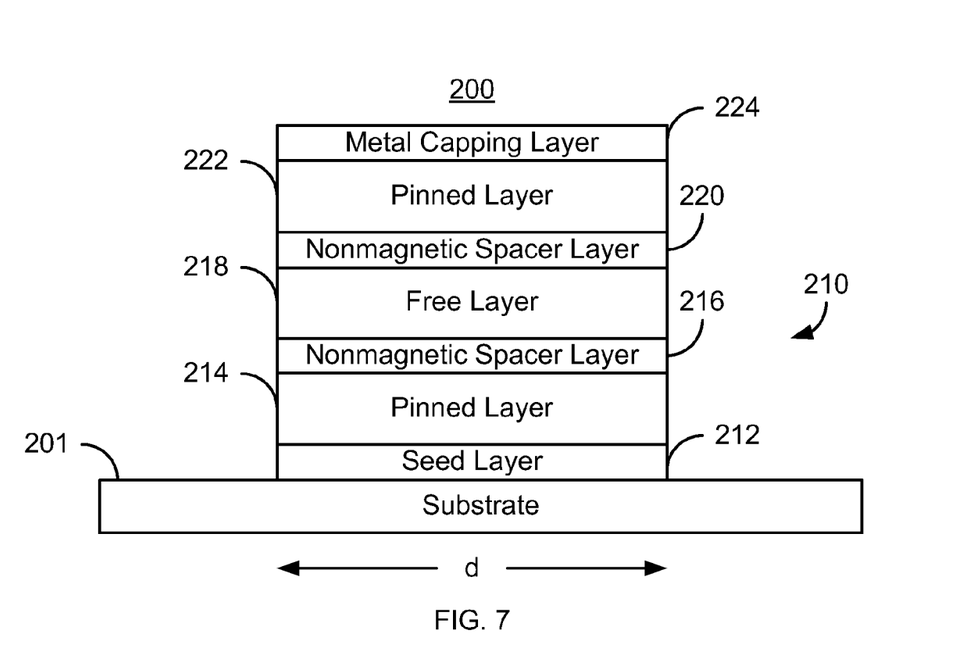
FIG. 7 depicts an exemplary embodiment of a magnetic junction switchable via spin transfer.

FIG. 7 depicts an exemplary embodiment of a magnetic memory 200 including a magnetic junction 210 switchable using spin transfer and which may be fabricated using the method 150 and/or the apparatus 100, 100' and/or 100". For clarity, FIG. 7 is not to scale. The magnetic memory includes a substrate 201, which may have additional components fabricated therein. For example, a selection device such as a transistor, conductive lines and/or other structures may be formed in the substrate. The magnetic junction 210 includes seed layer(s) 212, a pinned layer 214, a nonmagnetic spacer layer 216, a free layer 218, an optional second nonmagnetic spacer layer 220, an optional second pinned layer 222 and a capping layer. In the embodiment shown, the pinned layer 214 is self-pinned and thus requires no external pining layer. However, in other embodiments, pinning layer(s) such as AFM layers may be provided to fix or pin the magnetic moment of the pinned layers 214 and 222. In general, the pinning layer(s) would be used if the magnetic moments of the pinned layers 214 and 222 are in plane but would not be used if the magnetic moments of the pinned layers 214 and 222 are perpendicular to plane. The magnetic junction 210 is also configured to allow the free layer 218 to be switched between stable magnetic states when a write current is passed through the magnetic junction 200. Thus, the free layer 218 may be switchable utilizing spin transfer torque. Although two pinned layers 214 and 222 and two nonmagnetic spacer layers 216 and 220 are shown, in another embodiment, only one nonmagnetic spacer layer 216 or 220 and only one pinned layer 214 or 222 may be included.

The nonmagnetic spacer layers 216 and/or 220 may be tunneling barrier layers, conductors, or other structures for which magnetoresistance is exhibited between the free layer 218 and the pinned layers 214 and/or 222. The nonmagnetic spacer layers 216 and 220 may, but need not have a similar structure. For example, both layers 216 and 220 may be tunneling barriers, or one may be a tunneling barrier and the other a conductor. In some embodiments, the nonmagnetic spacer layers 216 and 220 are each a crystalline MgO tunneling barrier layer. In such embodiments, the MgO seed layer 204 may be employed to improve the TMR and other characteristics of the magnetic junction 200. It is hypothesized that the presence of the MgO seed layer improves the crystal structure of the tunneling barrier layer 220.

Although depicted as simple layers, the free layer 218 and/or the pinned layer(s) 212 and/or 222 may include multiple layers. For example, one or more of the layers 214, 218 and 222 may be a SAF including magnetic layers antiferromagnetically or ferromagnetically coupled through thin layers, such as Ru. In such a SAF, multiple magnetic layers interleaved with thin layer(s) of Ru or other material may be used. One or more of the layers 214, 218 and 222 may also be another multilayer. Although a magnetization is not depicted in FIG. 7, the free layer 218 and/or the pinned layer(s) 230 may each have a perpendicular anisotropy energy that exceeds the out-of-plane demagnetization energy. Thus, the free layer 210 and/or the pinned layer(s) 212 and 222 may each have its magnetic moment oriented perpendicular to plane. In other embodiments, the magnetic moment of the layer(s) 214, 218 and/or 220 are each in-plane. Other orientations of the magnetic moments of the free layer 218, the pinned layer 214, and/or the pinned layer 222 are possible.

Because the magnetic junction 210 may be fabricated using the method 150 and/or the apparatus 100, 100', and/or 100', the benefits of the method 150 and/or the apparatus 100, 100', and/or 100" may be attained'. In particular, the magnetic junction 210 may have improved performance and/or reduced variation in performance. Further, the fabrication method 150 may allow for a reduced critical dimension of the magnetic junction 210. For example, the magnetic junction 210 may have a diameter (or smallest critical dimension) of not more than twenty nanometers. In addition, the memory 200 may have a smaller distance between adjacent magnetic junctions 210 (e.g. row or column pitch) of two hundred nanometers or less. In some embodiments, the pitch is not more than one hundred nanometers. In some such embodiments, the pitch is not more than ninety nanometers. In the embodiment shown, the capping layer of step 160 was omitted or has not been provided yet. Thus, in addition to the benefits described above, a more dense memory may be provided.

Figure 8:
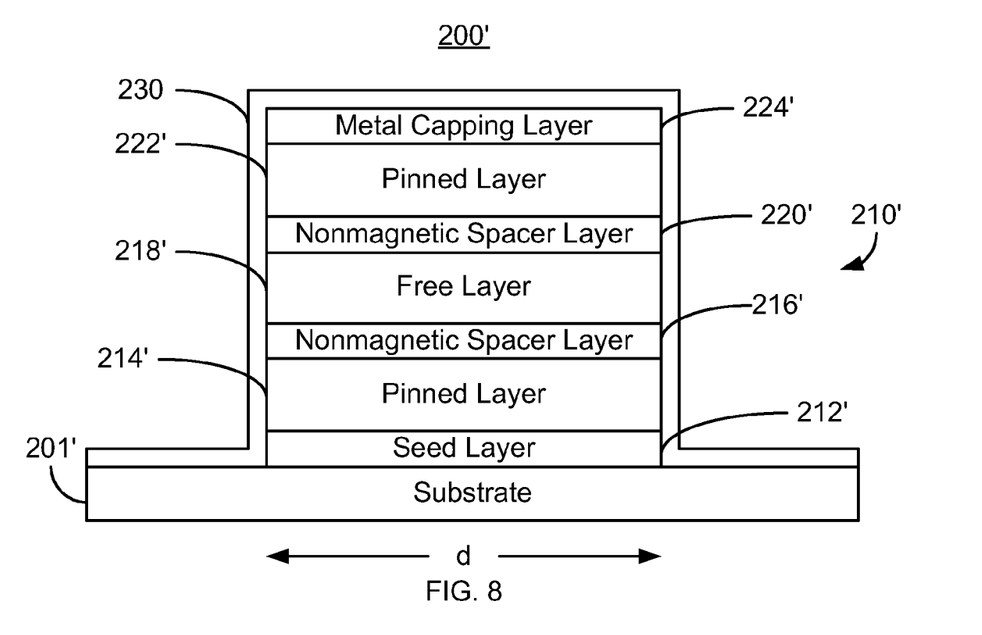
FIG. 8 depicts another exemplary embodiment of a magnetic junction switchable via spin transfer.

FIG. 8 depicts an exemplary embodiment of a magnetic memory 200' including a magnetic junction 210' switchable using spin transfer and which may be fabricated using the method 150 and/or the apparatus 100, 100' and/or 100". For clarity, FIG. 8 is not to scale. The magnetic memory 200 is analogous to the magnetic memory 200. The magnetic memory 200' is described in the context of the apparatus 100, 100', and 100" and the method 150. The substrate 201' and magnetic junction 210' are analogous to the substrate 201 and magnetic junction 210, respectively. Thus, analogous layers are labeled similarly. The magnetic junction 210' includes an optional seed layer 212', a pinned layer 214', a nonmagnetic spacer layer 216', a free layer 218', another nonmagnetic spacer layer 220', a pinned layer 222' and a capping layer 224' analogous to the layers 212, 214, 216, 218, 220, 222, and 224, respectively. Thus, the geometry, crystal structure, material(s) and properties of the optional seed layer 212', a pinned layer 214', a nonmagnetic spacer layer 216', a free layer 218', another nonmagnetic spacer layer 220', a pinned layer 222' and a capping layer 224' are analogous to those of the layers 212, 214, 216, 218, 220, 222 and 224, respectively. Further, the substrate 201' may be analogous to the substrate 201. Although two pinned layers 214' and 222' and two nonmagnetic spacer layers 216' and 220' are shown, in another embodiment, only one nonmagnetic spacer layer 216' or 220' and only one pinned layer 214' or 222' may be included.

In addition, the magnetic junction 210' includes a capping layer 230. The capping layer 230 is deposited in step 160 after the magnetic junction 210' is completely defined. Thus, the capping layer 230 substantially covers the sides of the magnetic junction 210'. In some embodiments, the capping layer 230 is a dielectric such as silicon nitride, silicon oxide, and/or aluminum oxide. However, another dielectric might be used. In the embodiment shown, the capping layer 230 is deposited in step 160 after the junction 210' has been milled but without exposing the memory 200' to ambient between the ion milling and the cap 230 deposition.

Because the magnetic junction 210' may be fabricated using the method 150 and/or the apparatus 100, 100', and/or 100", the benefits of the method 150 and/or the apparatus 100, 100', and/or 100" may be attained. In particular, the magnetic junction 210' may have improved performance and/or reduced variation in performance. Further, the fabrication method 150 may allow for a reduced critical dimension of the magnetic junction 210'. For example, the magnetic junction 210' may have a smaller critical dimension of not more than twenty nanometers. The memory 200' may have a smaller distance between adjacent magnetic junctions 210' (e.g. row or column pitch) of two hundred nanometers or less. In some embodiments, the pitch is not more than one hundred nanometers. In some such embodiments, the pitch is not more than ninety nanometers. Thus, in addition to the benefits described above, a more dense memory may be provided.

Figure 9:
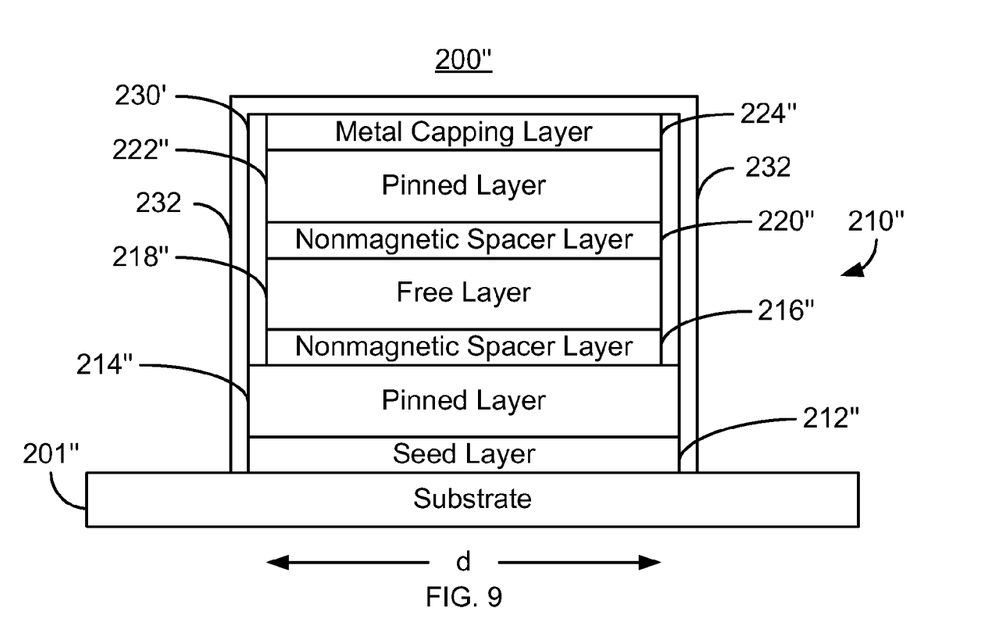
FIG. 9 depicts another exemplary embodiment of a magnetic junction switchable via spin transfer.

FIG. 9 depicts an exemplary embodiment of a magnetic memory 200" including a magnetic junction 210" switchable using spin transfer and which may be fabricated using the method 150 and/or the apparatus 100, 100' and/or 100". For clarity, FIG. 9 is not to scale. The magnetic memory 200" is analogous to the magnetic memories 200' and 200. The magnetic memory 200" is described in the context of the apparatus 100, 100', and 100" and the method 150. The substrate 201" and magnetic junction 210" are analogous to the substrate 201/201' and magnetic junction 210/210', respectively. Thus, analogous layers are labeled similarly. The magnetic junction 210" includes an optional seed layer 212", a pinned layer 214", a nonmagnetic spacer layer 216", a free layer 218", another nonmagnetic spacer layer 220", a pinned layer 222", a capping layer 224" and a capping layer 230' analogous to the layers 212/212', 214/214', 216/216', 218/218', 220/220', 222/222', 224/224', and 230 respectively. Thus, the geometry, crystal structure, material(s) and properties of the optional seed layer 212", a pinned layer 214", a nonmagnetic spacer layer 216", a free layer 218", another nonmagnetic spacer layer 220", a pinned layer 222", a capping layer 224" and capping layer 230' are analogous to those of the layers 212/212', 214/214', 216/216', 218/218', 220/220', 222/222', 224/224' and 230, respectively. Further, the substrate 201" may be analogous to the substrate 201/201'. Although two pinned layers 214" and 222" and two nonmagnetic spacer layers 216" and 220" are shown, in another embodiment, only one nonmagnetic spacer layer 216" or 220" and only one pinned layer 214" or 222" may be included.

The magnetic junction 210" includes a capping layer 230' and redeposition 232. More specifically, the magnetic junction 210" is partially milled through in step 158 and the capping layer 230' deposited in step 160. In the embodiment shown, the magnetic junction 210" is milled through to the interface between the nonmagnetic spacer layer 216" and the pinned layer 214" in step 158. However, in another embodiment, milling might terminate in another layer or at another interface. Defining the magnetic junction 210" is then completed. For example, additional ion mill(s) and/or RIE(s) may be carried out. However, during removal of portions of the layers 214" and 212", redeposition 232 is formed.

Because the magnetic junction 210" may be fabricated using the method 150 and/or the apparatus 100, 100', and/or 100", the benefits of the method 150 and/or the apparatus 100, 100', and/or 100" may be attained. In particular, the magnetic junction 210" may have improved performance and/or reduced variation in performance. Further, the fabrication method 150 may allow for a reduced critical dimension of the magnetic junction 210". For example, the magnetic junction 210" may have a smaller critical dimension of not more than twenty nanometers. The memory 200" may have a smaller distance between adjacent magnetic junctions 210' (e.g. row or column pitch) of two hundred nanometers or less. In some embodiments, the pitch is not more than one hundred nanometers. In some such embodiments, the pitch is not more than ninety nanometers. Thus, in addition to the benefits described above, a more dense memory may be provided.

Figure 10:
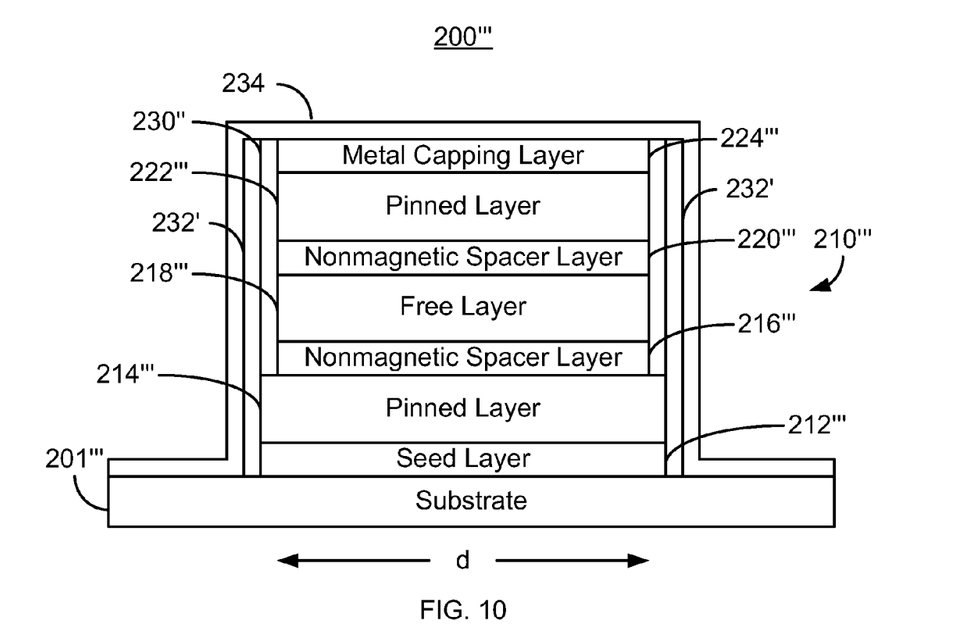
FIG. 10 depicts another exemplary embodiment of a magnetic junction using a magnetic insertion layer and switchable via spin transfer.

FIG. 10 depicts an exemplary embodiment of a magnetic memory 200''' including a magnetic junction 210''' switchable using spin transfer and which may be fabricated using the method 150 and/or the apparatus 100, 100' and/or 100". For clarity, FIG. 10 is not to scale. The magnetic memory 200" is analogous to the magnetic memories 200' and 200. The magnetic memory 200" is described in the context of the apparatus 100, 100', and 100" and the method 150. The substrate 201''' and magnetic junction 210''' are analogous to the substrate 201/201'/201" and magnetic junction 210/210'/210", respectively. Thus, analogous layers are labeled similarly. The magnetic junction 210''' includes an optional seed layer 212''', a pinned layer 214''', a nonmagnetic spacer layer 216''', a free layer 218''', another nonmagnetic spacer layer 220''', a pinned layer 222''', a capping layer 224''', a capping layer 230" and redeposition 232' analogous to the layers 212/212'/212", 214/214'/214", 216/216'/216", 218/218'/218", 220/220'/220", 222/222'/222", 224/224'/224", 230/230' and 232 respectively. Thus, the geometry, crystal structure, material(s) and properties of the optional seed layer 212''', pinned layer 214''', nonmagnetic spacer layer 216''', a free layer 218''', another nonmagnetic spacer layer 220''', a pinned layer 222''', a capping layer 224''', capping layer 230" and 232' are analogous to those of the layers 212/212'/212", 214/214'/214", 216/216'/216", 218/218'/218", 220/220'/2220", 222/222'/222", 224/224'/224", 230/230' and 232, respectively. Further, the substrate 201''' may be analogous to the substrate 201/201'/201". Although two pinned layers 214''' and 222''' and two nonmagnetic spacer layers 216''' and 220''' are shown, in another embodiment, only one nonmagnetic spacer layer 216''' or 220''' and only one pinned layer 214''' or 222''' may be included.

The magnetic junction 210''' includes capping layer 230", redeposition 232' and an additional capping layer 234. More specifically, the magnetic junction 210''' is partially milled through in step 158 and the capping layer 230' deposited in step 160. In the embodiment shown, the magnetic junction 210''' is milled through to the interface between the nonmagnetic spacer layer 216''' and the pinned layer 214''' in step 158. However, in another embodiment, milling might terminate in another layer or at another interface. Defining the magnetic junction 210''' is then completed. For example, additional ion mill(s) and/or RIE(s) may be carried out. However, during removal of portions of the layers 214''' and 212''', redeposition 232' is formed. An additional capping layer 234 is then deposited.

Because the magnetic junction 210''' may be fabricated using the method 150 and/or the apparatus 100, 100', and/or 100", the benefits of the method 150 and/or the apparatus 100, 100', and/or 100" may be attained. In particular, the magnetic junction 210''' may have improved performance and/or reduced variation in performance. Further, the fabrication method 150 may allow for a reduced critical dimension of the magnetic junction 210'''. For example, the magnetic junction 210''' may have a smaller critical dimension of not more than twenty nanometers. The memory 200''' may have a smaller distance between adjacent magnetic junctions 210' (e.g. row or column pitch) of two hundred nanometers or less. In some embodiments, the pitch is not more than one hundred nanometers. In some such embodiments, the pitch is not more than ninety nanometers. Thus, in addition to the benefits described above, a more dense memory may be provided.

Figure 11:
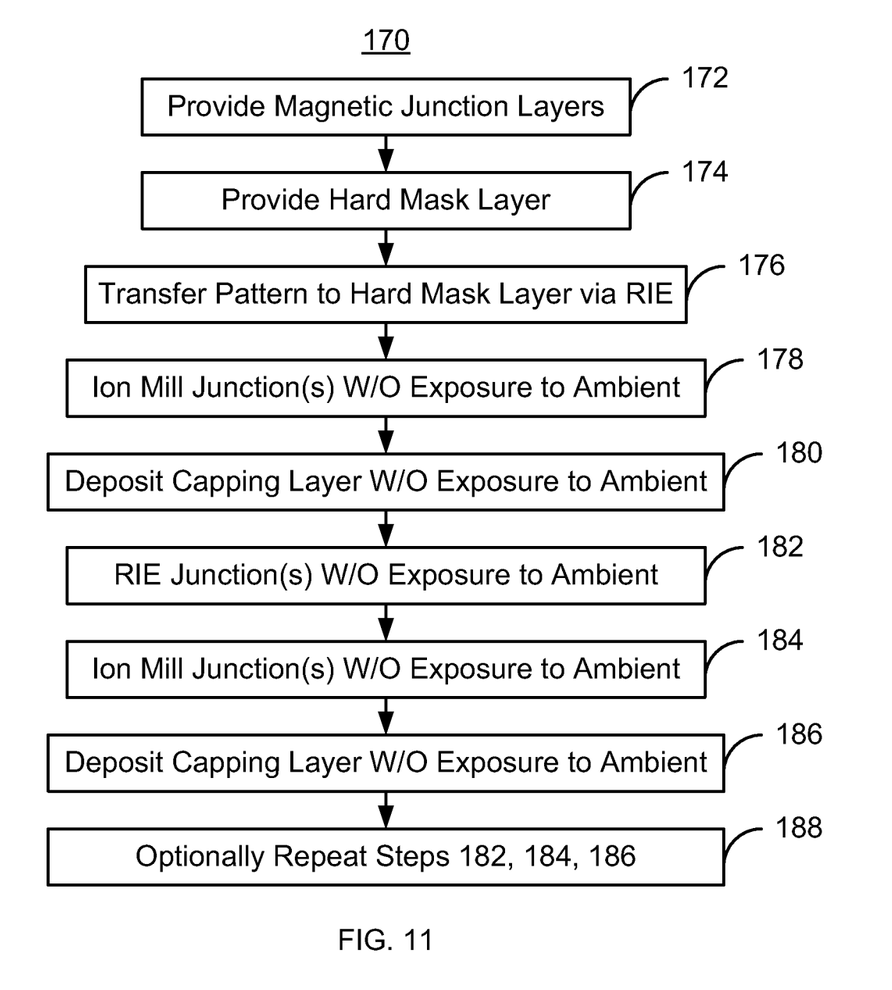
FIG. 11 depicts an exemplary embodiment of a method for fabricating a magnetic junction switchable via spin transfer.

FIG. 11 depicts an exemplary embodiment of a method 170 for fabricating a magnetic junction in a magnetic memory. For simplicity, some steps may be omitted, combined, interleaved and/or performed in another order. The method 170 is described in the context of the apparatus 100". However, the method 170 may be used with other apparatus such as the apparatus 100, 100' and/or another analogous apparatus. Further, the method 150 may be incorporated into fabrication of magnetic memories. Thus the method 150 may be used in manufacturing a STT-RAM or other magnetic memory. FIGS. 12-16 are diagrams depicting an exemplary embodiment of a magnetic memory 250 during fabrication using the method 170. For clarity, FIGS. 12-16 are not to scale and portions of the memory 250 are omitted. The method 170 and device 250 are also described in the context of particular layers. However, in some embodiments, such layers may include multiple sublayers. The magnetic junction being fabricated is switchable between a plurality of stable magnetic states when a write current is passed through the magnetic junction.

The magnetic junction layers are provided, via step 172. Step 172 may include depositing the desired materials at the desired thicknesses. Step 172 includes depositing any seed, pinning (e.g. antiferromagnetic), pinned, nonmagnetic spacer and free layers. In some embodiments, step 172 includes providing a single pinned layer, a barrier layer such as MgO, and a free layer. In some such embodiments, step 172 also includes depositing a second barrier layer such as MgO and a second pinned layer. First and second pining layers may also be deposited. The pinned layer(s) and/or free layer may be a SAF. In addition, high spin polarization layers, such as CoFeB adjoining the free layer and/or pinned layer may also be provided. Thus, step 172 is analogous to step 152.

A hard mask layer is also provided, via step 174. The hard mask may, for example, include W, Ta and/or another layer. Step 174 may include blanket depositing the hard mask layer on the magnetic junction layers. Step 174 is, therefore, analogous to step 154 of the method 150. Steps 172 and 174 may be performed in the apparatus 100", for example in the deposition chamber 108'.

Figure 12:
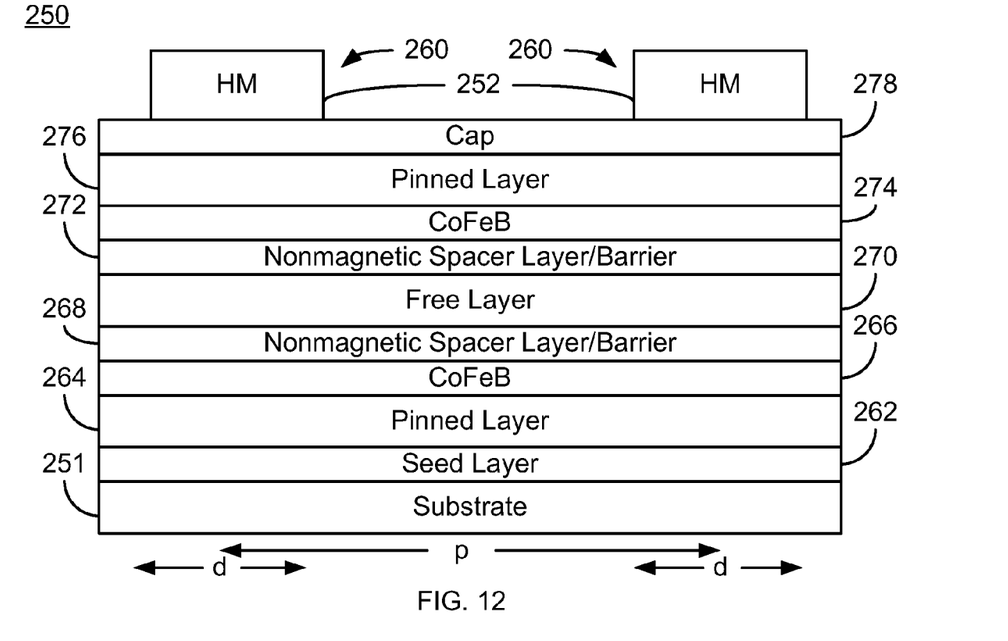
FIGS. 12-16 depict an exemplary embodiment of a magnetic junction switchable via spin transfer during fabrication.

A hard mask is formed from the hard mask layer using an RIE, via step 176. The RIE of step 176 may be performed in the RIE chamber 102". The RIE performed in step 176 may use reactive gases at pressures on the order of one millitorr. FIG. 12 depicts the magnetic memory 250 after step 176 has been performed. Thus, substrate 251 underlies optional seed layer 262, pinned layer 264, high spin polarization CoFeB layer 266, nonmagnetic spacer layer 268, free layer 270, second nonmagnetic spacer layer 272, second high spin polarization CoFeB layer 274, pinned layer 276, and capping layer 278. These layers 262, 264, 268, 270, 272 and 274 are analogous to the layers 212/212'/212"/212"', 214/214'/214"/214"', 216/216'/216"/216"', 218/218'/218"/218"', 220/220'/220"/220"', 222/222'/222"/222"' and 224/224'/224"/224"' of the magnetic junctions 210/210'/210"/210"', respectively. Also shown is hard mask 252. The hard mask 252 is to be used in forming magnetic junctions 260. The magnetic junctions 260 have a critical dimension, d, and a pitch, p, for the memory. The hard mask 252 is formed from a single layer using an RIE performed in the RIE chamber 102".

After the RIE is performed, the magnetic memory 250 is transferred from the RIE chamber 102" to the ion milling chamber 104" and partially ion milled, via step 178. This transfer is accomplished without exposing the magnetic memory 250 to ambient. Thus, the transfer may occur at vacuum, in the presence of an inert gas, or in another analogous manner. The ion mill is performed at an angle from normal to the surface of the magnetic memory 250. Typically this angle is on the order of twenty degrees. In the embodiment shown, the magnetic junction is partially defined. Thus, only a portion of the layers 262, 264, 266, 268, 270, 272, 274, 276 and 278 provided in step 172 for the magnetic junction are milled through in step 178. The ion milling of step 178 is performed without exposing the substrate (and thus the magnetic junctions 260 being formed) to an ambient between the RIE and the ion mill.

Figure 13:
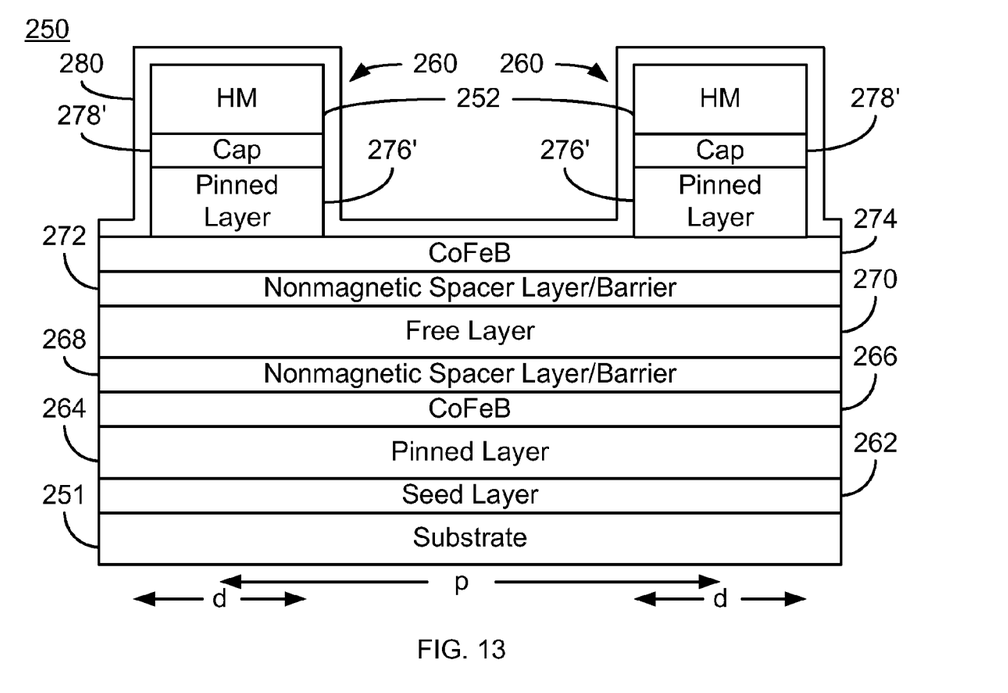

A capping layer is deposited, via step 180. The capping layer may be a dielectric. For example, silicon oxide, silicon nitride, and/or aluminum oxide may be used. The capping layer is deposited after the ion milling step and without exposing the magnetic memory to the ambient after the ion milling step 178. For example, the magnetic memory 250 may be moved from the ion milling chamber 104" to the deposition chamber 108', and the cap deposited in the deposition chamber 108'. FIG. 13 depicts the magnetic memory 250 after step 180 is performed. In the embodiment shown, the cap layer 278' and pinned layer 276' have been defined. In addition, the capping layer 280 has been deposited.

Figure 14:
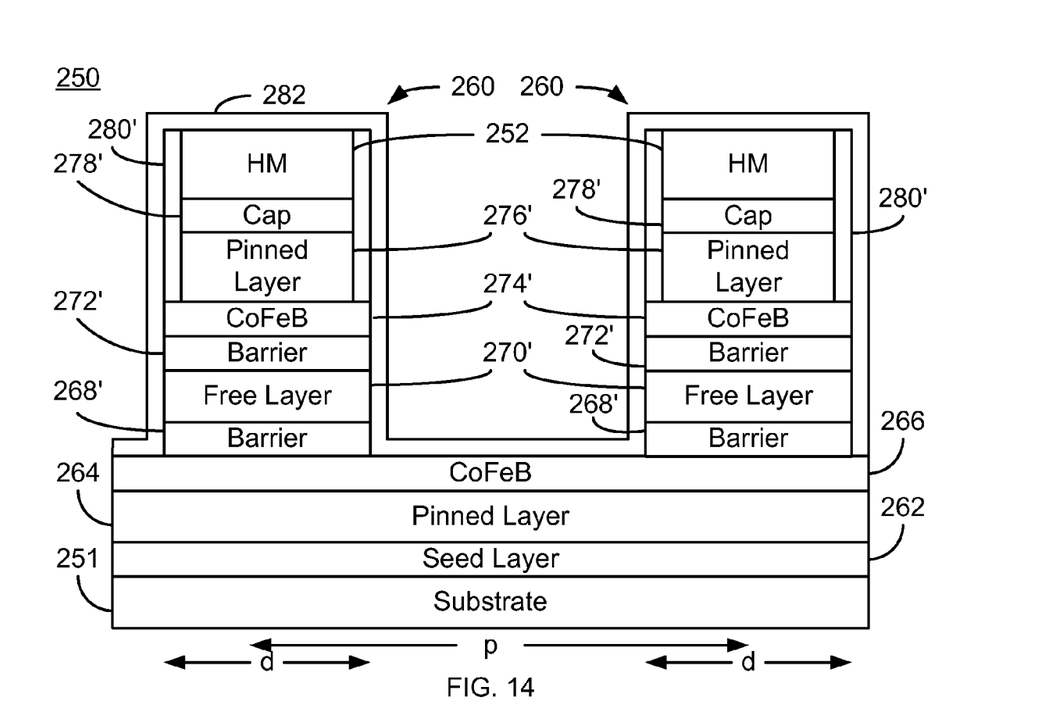

An additional RIE performed without exposing the magnetic memory 250 to ambient, via step 182. Step 182 may be performed by transferring the magnetic memory 250 from the deposition chamber 108' to the RIE chamber 102". The transfer may be under vacuum, in the presence of an inert gas, or in another analogous manner. FIG. 14 depicts the magnetic memory 250 after step 182 has been performed. Thus, the layers 268', 270', 272' and 274' have been defined for the magnetic junctions 260. In addition, redeposition 282 has formed on the sides of the magnetic junctions 260.

Figure 15:
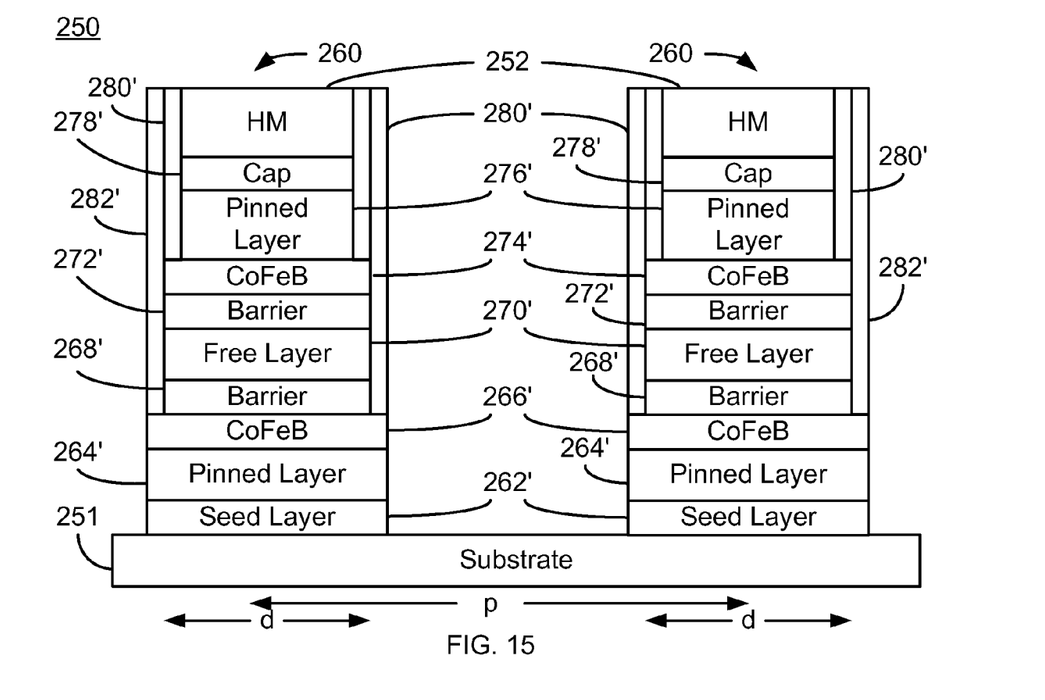

The magnetic memory is then ion milled again, via step 184. The ion milling is performed without exposing the magnetic memory 250 to ambient. Step 184 may be performed by transferring the magnetic memory 250 from the RIE chamber 102" to the ion milling chamber 104". The transfer may be under vacuum, in the presence of an inert gas, or in another analogous manner. FIG. 15 depicts the magnetic memory 250 after step 184 has been performed. Thus, the layers 266', 264' and 262' have been defined. The magnetic junctions 260 have thus been formed.

Figure 16:
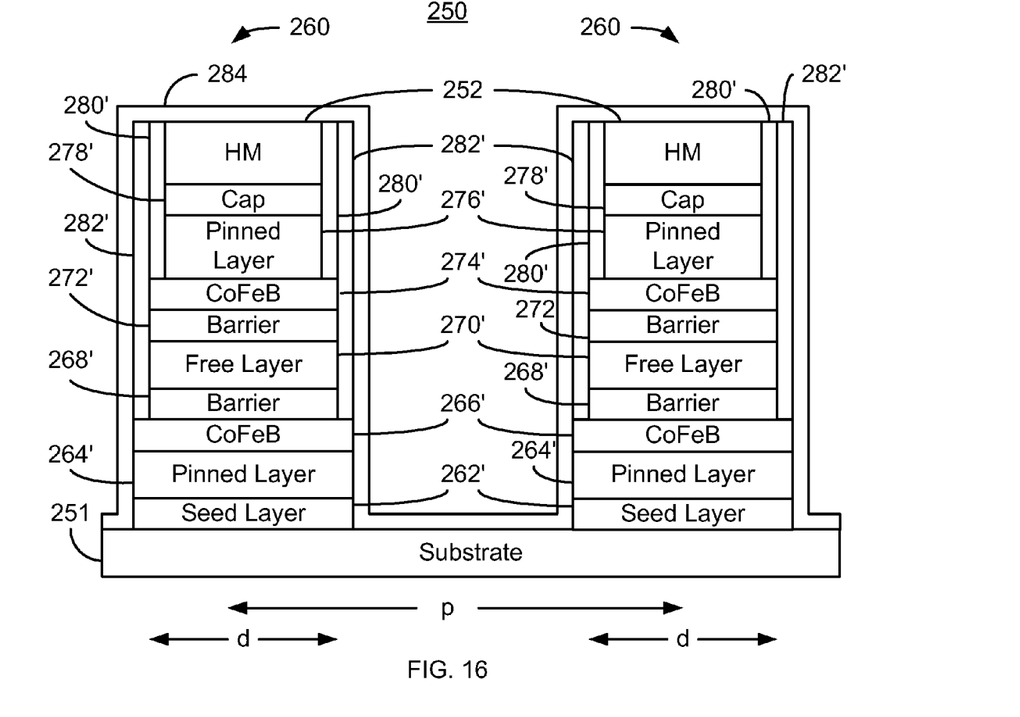

A capping layer is deposited, via step 186. The capping layer may be a dielectric. For example, silicon oxide, silicon nitride, and/or aluminum oxide may be used. The capping layer is deposited after the ion milling step 184 and without exposing the magnetic memory to the ambient after the ion milling step 184. For example, the magnetic memory 250 may be moved from the ion milling chamber 104" to the deposition chamber 108', and the cap deposited in the deposition chamber 108'. FIG. 16 depicts the magnetic memory 250 after step 186 is performed. The capping layer 284 has been deposited. Consequently, the magnetic junctions 260 are not exposed to ambient even if the magnetic memory 250 is. The magnetic memory 250 may be removed from the apparatus 100" without damage to the magnetic junctions 260. Note that in the embodiment shown, the layers that are defined later have a larger critical dimension due to the presence of the capping layer 280/280' and the redeposition 282/282'. In other embodiments, some or all of the redeposition layer 282/282' and/or the capping layer 280/280' may be removed between steps.

If the magnetic junctions 260 had not been completely defined by step 186 then steps 182, 184, and 186 may be repeated to completely define the magnetic junctions 260. Thus, the magnetic junctions 260 may be defined using a hybrid process that includes a combination of RIE(s), ion mill(s) and deposition of capping layer(s).

Using the method 170, the magnetic junctions 260 may be formed. Because the magnetic junctions 260 are defined without exposing the magnetic memory 250 to ambient, damage to the magnetic junctions 260 may be reduced. For example, the formation of HF, HCl or like compounds may be reduced or eliminated because the redeposition 282 is not exposed to ambient. After the magnetic junctions 260 have been defined, the capping layer 284 may enclose the redeposition 282'. Thus, further damage to the magnetic junctions 260 may be prevented. Thus, performance of the magnetic junctions 260 may be enhanced and yield for the method 170 improved. In addition, magnetic junctions having a smaller critical dimension and/or a smaller pitch may be achieved. For example, the critical dimension may be not more than twenty nanometers. In some embodiments, the pitch may be not more than two hundred nanometers. In some such embodiments, the pitch may be not more than one hundred nanometers.

Figure 17:
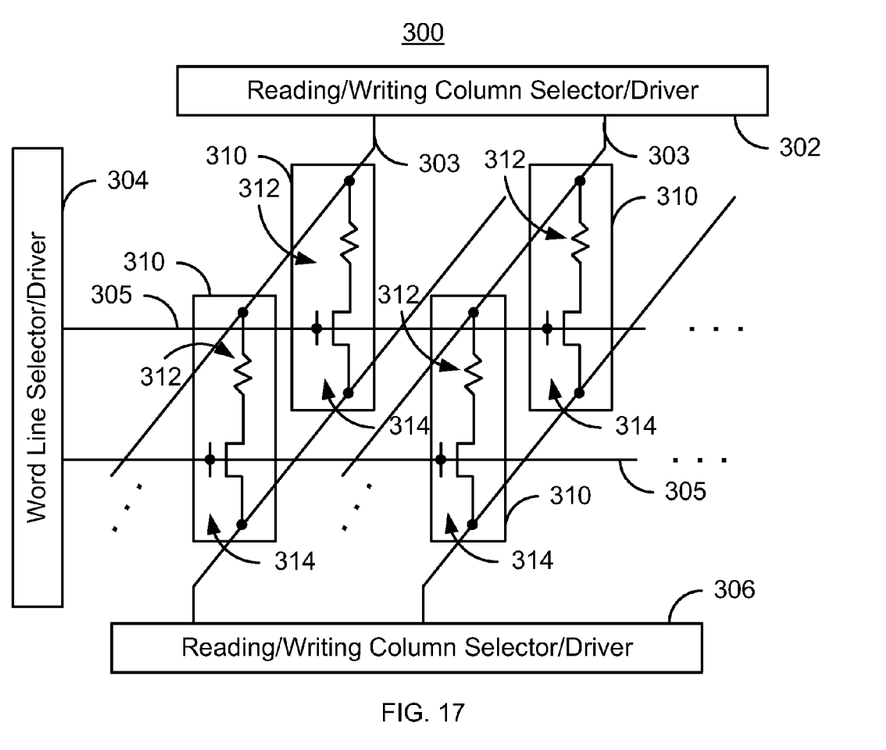
FIG. 17 depicts an exemplary embodiment of a memory utilizing magnetic junctions in the memory element(s) of the storage cell(s).

FIG. 17 depicts an exemplary embodiment of a memory utilizing magnetic junctions in the memory element(s) of the storage cell(s). The magnetic junctions 200, 200', 200", 200"' and/or 260 may be used in a magnetic memory. FIG. 17 depicts an exemplary embodiment of one such memory 300. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may include one or more of the magnetic junctions 200, 200', 200", 200"' and/or 260. Although one magnetic junction 312 is shown per cell 310, in other embodiments, another number of magnetic junctions 312 may be provided per cell.

The magnetic junctions 312 are formed using the method 150 and/or 170 and may be formed using the apparatus 100, 100' or 100". Thus, the pitch and cell size of the magnetic memory 300 may be reduced. Consequently, a higher density magnetic memory 300 may be formed. Further, because the magnetic junctions 310 are less likely to be damaged, yield for the magnetic memories 300 may be improved.

A method and apparatus for providing magnetic junctions, magnetic junctions and a memory including the magnetic junctions have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing at least one magnetic junction on a substrate for use in a magnetic memory, the magnetic junction being configured to be switchable between a plurality of stable magnetic states when a write current is passed through the magnetic junction comprising:
providing a plurality of magnetic junction layers for the at least one magnetic junction;
providing a hard mask layer on the plurality of magnetic junction layers;
forming a hard mask from the hard mask layer using a reactive ion etch (RIE);
ion milling the plurality of magnetic junction layers after performing the RIE and without exposing the magnetic memory to an ambient after the RIE, the step of ion milling the plurality of magnetic junction layers defining at least a portion of each of the at least one magnetic junction.

2. The method of claim 1 further comprising:
providing a capping layer on the at least one magnetic junction after the step of ion milling the plurality of magnetic junction layers and without exposing the magnetic memory to the ambient after the step of ion milling the plurality of magnetic junction layers.

3. The method of claim 2 wherein the step of ion milling the plurality of magnetic junction layers defines each of the at least one magnetic junction.

4. The method of claim 2 wherein the step of ion milling defines only a portion of each of the at least one magnetic junction, the method further including:
performing at least one additional RIE after the step of providing the capping layer and without exposing the magnetic memory to the ambient after the step of providing the capping layer.

5. The method of claim 4 wherein the plurality of magnetic junction layers includes a first reference layer, a first barrier layer, a free layer, a second barrier layer and a second free layer, wherein the step of ion milling defines the second reference layer, the at least one additional RIE defines the second barrier layer, the free layer and at least a portion of the first barrier layer.

6. The method of claim 4 further comprising:
performing at least one additional ion milling after the step of performing the at least one additional RIE, the at least one additional ion milling defining an additional portion of the at least one magnetic junction and without exposing the magnetic memory to the ambient after the step of performing the at least one additional RIE.

7. The method of claim 4 further comprising:
performing at least one additional ion milling after the step of performing the at least one additional RIE, the at least one additional ion milling defining an additional portion of the at least one magnetic junction and without exposing the magnetic memory to the ambient after the step of performing the at least one additional RIE.

8. The method of claim 5 further comprising:
providing at least one additional capping layer after the step of performing the at least one additional ion milling and without exposing the magnetic memory to the ambient after the step of providing the at least one additional ion milling.

* * * * *